(12) United States Patent
Chan et al.

(10) Patent No.: US 9,355,887 B2
(45) Date of Patent: May 31, 2016

(54) DUAL TRENCH ISOLATION FOR CMOS WITH HYBRID ORIENTATIONS

(75) Inventors: Victor Chan, New Paltz, NY (US); Meikei Ieong, Wappingers Falls, NY (US); Rajesh Rengarajan, Fishkill, NY (US); Alexander Reznicek, Mount Kisko, NY (US); Chun-yung Sung, Poughkeepsie, NY (US); Min Yang, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 838 days.

(21) Appl. No.: 13/349,203

(22) Filed: Jan. 12, 2012

(65) Prior Publication Data
US 2012/0104511 A1    May 3, 2012

Related U.S. Application Data

(60) Division of application No. 12/169,991, filed on Jul. 9, 2008, now Pat. No. 8,097,516, which is a continuation of application No. 11/877,048, filed on Oct. 23, 2007, now abandoned, which is a division of application No. 11/207,216, filed on Aug. 19, 2005, now abandoned.

(51) Int. Cl.
*H01L 21/70* (2006.01)
*H01L 21/762* (2006.01)

(52) U.S. Cl.
CPC .................. *H01L 21/76229* (2013.01)

(58) Field of Classification Search
None
See application file for complete search history.

(56) References Cited

U.S. PATENT DOCUMENTS

| | | | | |
|---|---|---|---|---|
| 5,455,194 A | * | 10/1995 | Vasquez et al. | 438/425 |
| 6,414,355 B1 | * | 7/2002 | An et al. | 257/347 |
| 6,420,771 B2 | | 7/2002 | Gregory | |
| 6,583,060 B2 | * | 6/2003 | Trivedi | 438/700 |
| 6,720,638 B2 | * | 4/2004 | Tran | 257/499 |
| 6,780,728 B2 | * | 8/2004 | Tran | 438/400 |
| 6,790,781 B2 | * | 9/2004 | Trivedi | 438/700 |
| 6,821,826 B1 | | 11/2004 | Chan et al. | |
| 6,830,962 B1 | | 12/2004 | Guarini et al. | |
| 6,875,697 B2 | * | 4/2005 | Trivedi | 438/700 |
| 6,902,962 B2 | | 6/2005 | Yeo et al. | |

(Continued)

OTHER PUBLICATIONS

Bengtsson, Stefan et al., Interface Charge Control of Directly Bonded Silicon Structures, 66 J. Appl. Phys. 1231 (1989).

(Continued)

*Primary Examiner* — David E Graybill
(74) *Attorney, Agent, or Firm* — Scully, Scott, Murphy & Presser, P.C.

(57) ABSTRACT

The present invention provides a semiconductor structure in which different types of devices are located upon a specific crystal orientation of a hybrid substrate that enhances the performance of each type of device. In the semiconductor structure of the present invention, a dual trench isolation scheme is employed whereby a first trench isolation region of a first depth isolates devices of different polarity from each other, while second trench isolation regions of a second depth, which is shallower than the first depth, are used to isolate devices of the same polarity from each other. The present invention further provides a dual trench semiconductor structure in which pFETs are located on a (110) crystallographic plane, while nFETs are located on a (100) crystallographic plane. In accordance with the present invention, the devices of different polarity, i.e., nFETs and pFETs, are bulk-like devices.

11 Claims, 4 Drawing Sheets

(56) References Cited

U.S. PATENT DOCUMENTS

| | | |
|---|---|---|
| 7,023,055 B2 | 4/2006 | Ieong et al. |
| 7,023,057 B2 | 4/2006 | Ieong et al. |
| 7,329,923 B2 | 2/2008 | Doris et al. |
| 7,354,812 B2 * | 4/2008 | Batra et al. .................... 438/196 |
| 2003/0013309 A1 * | 1/2003 | Trivedi .......................... 438/700 |
| 2003/0207525 A1 * | 11/2003 | Trivedi .......................... 438/200 |
| 2003/0234433 A1 * | 12/2003 | Tran ............................... 257/506 |
| 2005/0020088 A1 * | 1/2005 | Trivedi .......................... 438/700 |
| 2005/0093077 A1 | 5/2005 | Ieong et al. |
| 2005/0250271 A1 * | 11/2005 | Wang et al. .................. 438/197 |
| 2006/0024931 A1 | 2/2006 | Chan et al. |
| 2006/0043455 A1 * | 3/2006 | Batra et al. .................... 257/314 |
| 2006/0043522 A1 * | 3/2006 | Trivedi .......................... 257/506 |
| 2006/0073646 A1 | 4/2006 | Yang |
| 2006/0148143 A1 | 7/2006 | Bedell et al. |
| 2006/0166437 A1 * | 7/2006 | Korber .......................... 438/257 |
| 2006/0175659 A1 * | 8/2006 | Sleight .......................... 257/347 |
| 2007/0040235 A1 | 2/2007 | Chan et al. |
| 2008/0036028 A1 | 2/2008 | Chan et al. |
| 2008/0290379 A1 | 11/2008 | Chan et al. |
| 2012/0104511 A1 * | 5/2012 | Chan et al. .................... 257/369 |

OTHER PUBLICATIONS

Farrens, Shari N. et al., Chemical Free Room Temperature Wafer to Wafer Direct Bonding, 142 J. Electrochem. Soc. 3949 (1995).

Shimgo, M. et al., Silicon-to-Silicon Direct Bonding Method, 60 J. Appl. Phys. 2987 (1986).

* cited by examiner

DUAL TRENCH ISOLATION FOR CMOS WITH HYBRID ORIENTATIONS

RELATED APPLICATIONS

This application is a divisional application of U.S. patent application Ser. No. 12/169,991, filed Jul. 9, 2008 which is a continuation application of U.S. patent application Ser. No. 11/877,048, filed Oct. 23, 2007, now U.S. Patent Application Publication No. 2008/0036028, which is a divisional application of U.S. patent application Ser. No. 11/207,216, filed Aug. 19, 2005, now U.S. Patent Application Publication No. 2007/0040235. This application is related to co-pending and co-assigned U.S. patent application Ser. No. 10/799,380, filed Mar. 12, 2004, now U.S. Pat. No. 7,023,057, Ser. No. 10/696,634, filed Oct. 29, 2003, now U.S. Pat. No. 7,023,055, and Ser. No. 10/250,241, filed Jun. 23, 2003, now U.S. Pat. No. 7,329,923, the entire contents of each application are incorporated herein by reference.

FIELD OF THE INVENTION

The present invention relates to high-performance metal oxide semiconductor field effect transistors (MOSFETs) for digital and analog applications, and more particular to MOSFETs utilizing carrier mobility enhancement from surface orientation in which a dual trench isolation design is employed. Specifically, a first trench isolation region having a first depth is used to isolate nFETs from pFETs, while second trench isolation regions having a second depth, which is shallower than the first depth, are used to isolate nFETs from nFETs and pFETs from pFETs.

BACKGROUND OF THE INVENTION

In present semiconductor technology, complementary metal oxide semiconductor (CMOS) devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above discussion, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Methods have been described to form planar hybrid substrates with different surface orientations through wafer bonding. In such endeavors, the planar hybrid substrate is obtained mainly through semiconductor-to-insulator, or insulator-to-insulator wafer bonding to achieve pFETs and nFETs on their own optimized crystal orientation for high performance device manufacture. However, at least one type of MOSFET (either pFETs or nFETs) is on a semiconductor-on-insulator (SOI), while the other type of MOSFET is either on a bulk semiconductor or an SOI with a thicker SOI film.

A method to fabricate planar bulk-like nFETs and pFETs on a hybrid orientated substrate through silicon-to-silicon direct bonding to achieve both kinds of devices on their optimized orientation for highest performance has been disclosed, for example, in U.S. application Ser. No. 10/799,380, filed Mar. 12, 2004, now U.S. Pat. No. 7,023,057 and Ser. No. 10/696,634, filed Oct. 29, 2003, now U.S. Pat. No. 7,023,055.

In today's conventional CMOS integrated circuits (ICs) with bulk-like pFETs and nFETs, isolation usually is achieved by shallow trench isolation (STI). Such a structure is shown, for example, in FIG. 1. In the prior art structure, reference numeral 100 denotes the semiconductor substrate, reference numeral 102 denotes a p-well, reference numeral 104 denotes an n-well, reference numeral 106 denotes shallow trench isolation (STI), reference numeral 108 denotes an nFET, reference numeral 110 denotes a pFET, reference numeral 112 denotes a p-well (or substrate) contact and reference numeral 114 denotes an n-well (or substrate) contact.

In the prior art structure shown in FIG. 1, each STI 106 is formed by first etching relatively shallow trenches (on the order of about 0.3 to about 0.5 μm), which are shallower than the depth of the well, into the semiconductor substrate 100 and then each trench is filled with a trench dielectric material such as an oxide. The surface is planarized after trench fill to complete the isolation structure. However, as the ground rule shrinks, the width of the STI reduces, resulting in a higher aspect ratio. Thus, it has become more difficult to obtain void- and seam-free trench fill.

On the other hand, CMOS isolation exists not only between like-kind of devices, e.g., between two nFETs or two pFETs, but also between opposite polarity, i.e., between nFETs and pFETs which are separated by at least one well. In general, isolation for the latter, including nFET and pFET isolation and latch-up, consumes much more chip area and requires much deeper STI depth.

In view of the above discussion, there is a need for providing a structure having both pFETs and nFETs on a hybrid oriented (HOT) substrate with different crystal orientations, wherein both the pFET and nFET devices are bulk-like, and wherein the pFET and nFET devices are separated from devices with opposite polarity.

SUMMARY OF THE INVENTION

The present invention provides a semiconductor structure in which different types of devices are located upon a specific crystal orientation of a hybrid substrate that enhances the performance of each type of device. In the semiconductor structure of the present invention, a dual trench isolation scheme is employed whereby a first trench isolation region of a first depth isolates devices of different polarity from each other, while second trench isolation regions of a second depth, which is shallower than the first depth, are used to isolate devices of the same polarity from each other.

The present invention further provides a dual trench semiconductor structure in which pFETs are located on a (110) crystallographic plane, while nFETs are located on a (100) crystallographic plane. In accordance with the present invention, the devices of different polarity, i.e., nFETs and pFETs, are bulk-like devices.

In broad terms, the semiconductor structure of the present invention comprises:

a hybrid oriented substrate having at least two coplanar surfaces of different crystallographic orientation, said surfaces defining at least a first device region and a second device region;

a first trench isolation region of a first depth separating said first device region from said second device region; and a plurality of second trench isolation regions of a second depth which is shallower than the first depth located in each of said first and second device regions, whereby said first trench isolation region is employed in separating semiconductor devices of different polarity from each other and said plurality of second trench isolation regions are employed in separating semiconductor devices of the same polarity from each other.

The present invention further includes the semiconductor structure as defined above in which first semiconductor devices of a first polarity are located in the first device region and second devices of a second polarity which are opposite from the first polarity devices are located in the second device region. The semiconductor devices employed in the present invention are typically nFETs and pFETs. When such semiconductor devices are used, the first trench isolation region (having the deeper depth of the two isolation regions) is used in separating nFETs from pFETs, while the second trench isolation regions (having the shallower of the two trench depths) are used in separating like-kind devices, i.e., nFETs from nFETs and pFETs from pFETs.

In addition to semiconductor structures, the present invention also relates to methods of forming such structures. In broad terms, the method of the present invention comprises the steps of:

providing a hybrid substrate comprising a first lower semiconductor layer of a first crystallographic orientation and a second upper semiconductor layer of a second crystallographic orientation which differs from the first crystallographic orientation, wherein a conductive bonding interface separates said semiconductor layers from each other;

providing at least one opening of a first depth in said hybrid substrate which exposes said first lower semiconductor layer;

forming a spacer within said at least one opening having said first depth;

regrowing a semiconductor material on said exposed first lower semiconductor layer, said semiconductor material having said first crystallographic orientation;

planarizing said semiconductor material to an upper surface of said second upper semiconductor layer to provide a structure having at least two coplanar surfaces of different crystallographic orientation; and forming trench isolation regions having a second depth which is shallower than the first depth of said opening in said at least two coplanar surfaces, wherein said spacer provides isolates between the coplanar surfaces of different crystallographic orientations.

In accordance with the present invention, the method of the present invention further comprises forming first semiconductor devices having a first polarity on one of said coplanar surfaces of different crystallographic orientation and forming second semiconductor devices having a second polarity on the other coplanar surface. Thus, nFETs can be built into one of the crystallographic surfaces, while pFETs can be built into the other crystallographic surface. In accordance with the present invention, the pFETs are built into a crystal surface that provides those kinds of FETs with optimal performance (usually a (110) crystallographic plane) and the nFET are built into a crystal surface that provides those kinds of devices with optimal performance (usually a (100) crystal plane).

When such semiconductor devices are formed, the spacer within the opening defines a first trench isolation region of said first depth that isolates nFETs from pFETs, while the shallow trench isolations of said second depth define second trench isolation regions that separate nFETs from nFETs and pFETs from pFETs.

DETAILED DESCRIPTION OF THE INVENTION

Figure 1:
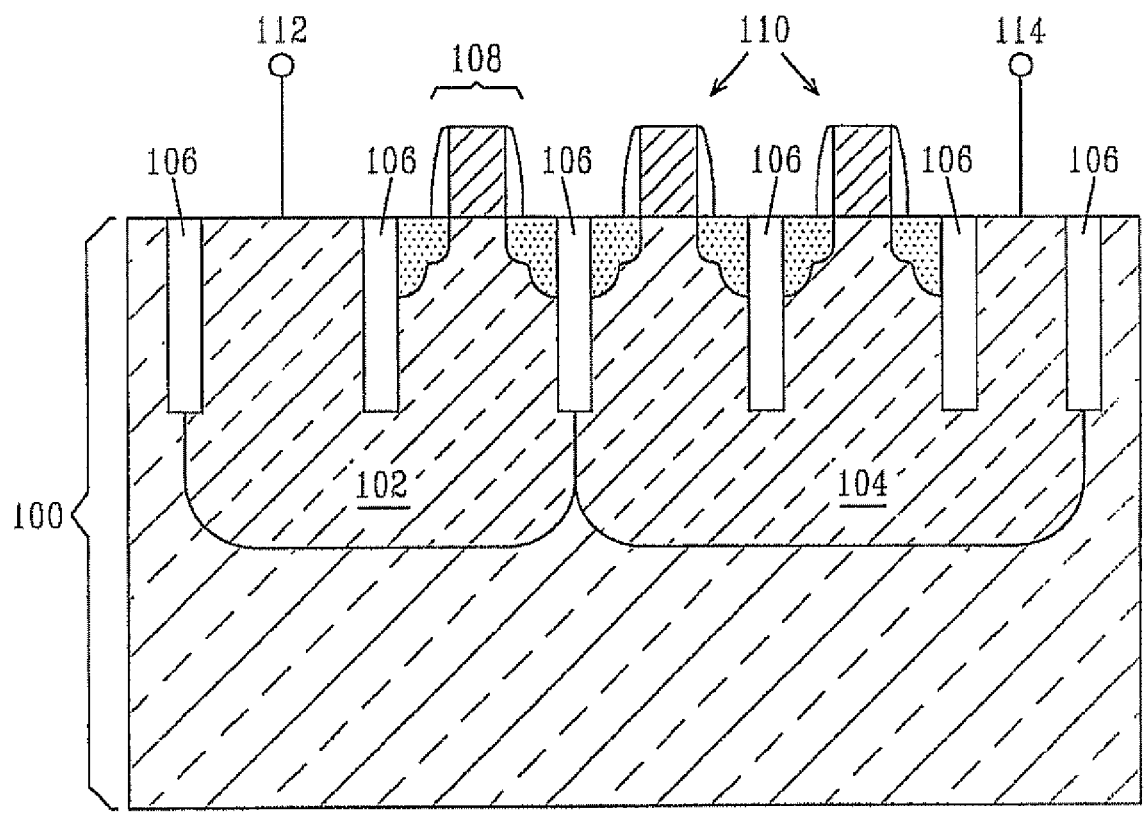
FIG. 1 is a pictorial representation (through a cross sectional view) illustrating a prior art structure including MOSFETs on a bulk substrate in which isolation between nFET and nFET, pFET and pFET, and nFET and pFET is done simultaneously.

The present invention, which relates to dual trench isolation for CMOS devices located on a hybrid oriented substrate, will now be described in greater detail by referring to the drawings that accompany the present application. It is noted that the drawings of the present invention are provided for illustrative purposes and thus they are not drawn to scale.

Figure 2:
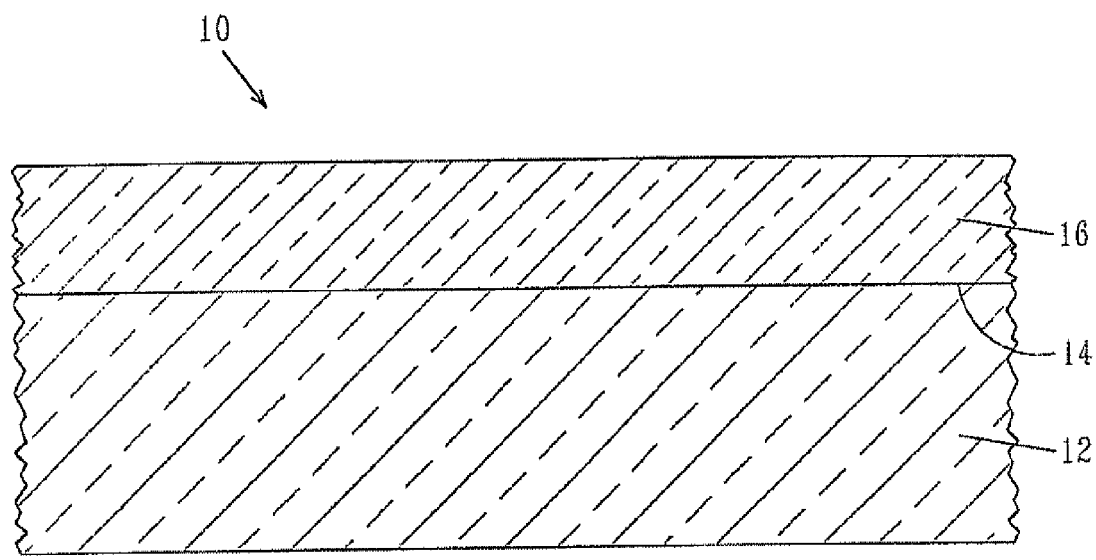
FIG. 2 is a pictorial representation (through a cross sectional view) showing a hybrid substrate that can be employed in the present invention having different surface orientations which is obtained by semiconductor-to-semiconductor direct bonding.

Reference is first made to FIG. 2 which shows an initial hybrid substrate 10 having different crystal orientations that can be employed in the present invention. Specifically, the hybrid substrate 10 includes a first (i.e., bottom) semiconductor layer 12 and a second (i.e., top) semiconductor layer 16 having a bonding interface 14 located therebetween. In accordance with the present invention, the first semiconductor layer 12 has a first crystallographic orientation and the second semiconductor layer 16 has a second crystallographic orientation which differs from that of the first crystallographic orientation.

The first semiconductor layer 12 of the hybrid substrate 10 is comprised of any semiconductor material including, for example, Si, SiC, SiGe, SiGeC, Ge, GaAs, InAs, InP as well as other III/V or II/VI compound semiconductors. Combinations of the aforementioned semiconductor materials are also contemplated herein. The first semiconductor layer 12 may be strained, unstrained, or a combination of strained and unstrained layers can be used. Typically, the first semiconductor layer 12 is a Si-containing semiconductor material.

The first semiconductor layer 12 is also characterized as having a first crystallographic orientation which may be, for example, (110), (111), or (100). The first semiconductor layer 12 may optionally be formed on top of a handling wafer.

The thickness of the first semiconductor layer 12 may vary and is not critical for practicing the present invention. Typically however, the first semiconductor layer 12 is a bulk handle wafer, its thickness is the thickness of a wafer.

The second semiconductor layer 16 is comprised of any semiconducting material which may be the same or different from that of the first semiconductor layer 12. Thus, the second semiconductor layer 16 may include, for example, Si, SiC, SiGe, SiGeC, Ge, GaAs, InAs, InP as well as other III/V or II/VI compound semiconductors. The second semiconductor layer 16 may also include combinations of the aforementioned semiconductor materials. Second semiconductor layer 16 may also be strained, unstrained or a combination of strained and unstrained layers can be used, e.g., strained Si on relaxed SiGe. Typically, the second semiconductor layer 16 is comprised of a Si-containing semiconductor material.

The second semiconductor layer 16 is also characterized as having a second crystallographic orientation, which is different from the first crystallographic orientation. Thus, the crystallographic orientation of the second semiconductor layer 16 can be, for example, (100), (111), or (110) with the proviso that the crystallographic orientation of the second semiconductor layer 16 is not the same as the crystallographic orientation of the first semiconductor layer 12.

The thickness of the second semiconductor layer 16 may vary depending on the initial starting wafer used to form the hybrid substrate 10. Typically, however, the second semiconductor layer 16 has a thickness from about 50 nm to about 200 µm, with a thickness from about 150 nm to about 2 µm being more highly preferred.

The bonding interface 14 that is present between the first semiconductor layer 12 and the second semiconductor layer 16 is conductive. The bonding interface 14 typically has a thickness from about 10 nm or less. The thickness of the bonding interface 14 is determined by the bonding process used.

The exact crystal orientations of the first semiconductor layer 12 and the second semiconductor layer 16 may vary depending on the material of the semiconductor layers as well as the type of semiconductor devices that will be subsequently formed thereon. For example, when Si is employed as the semiconductor material, electron mobility is higher on a (100) surface orientation, and hole mobility is higher on a (110) surface orientation. In this case, the (100) Si surface is used as the device layer for nFETs, while the (110) Si surface is used as the device layer for pFETs.

The hybrid substrate 10 shown in FIG. 2 is formed in the present invention through semiconductor-to-semiconductor direct bonding. In such a process, two semiconductor substrates or wafers are directly bonded together without the presence of an insulating layer therebetween. The two wafers used in fabricating the hybrid substrate 10 may include two bulk semiconductor wafers, a bulk semiconductor wafer and a wafer containing an etch stop layer and a handling wafer, or a first bulk wafer and a second bulk wafer which includes an ion implant region, such as a hydrogen implant (i.e., $H_2$) region, which can be used to split a portion of at least one of the wafers during bonding.

In some embodiments of the present invention the bonding process described in U.S. Ser. No. 10/250,241, now U.S. Pat. No. 7,329,923, the entire content of which is incorporated herein by reference, can be employed.

To achieve a good conductive bonding interface 14 through semiconductor-to-semiconductor direct wafer bonding, it is usually, but not always, required to perform a surface treatment step on at least one, preferably both, of the wafers, before bonding to obtain either hydrophilic or hydrophobic surfaces.

Hydrophobic surfaces can be achieved, for example, by utilizing a HF dip process such as disclosed in S. Bengtsson, et al., "Interface charge control of directly bonded silicon structures", J. Appl. Phys. V66, p 1231, (1989), while hydrophilic surfaces can be achieved by either a dry clean process, such as, for example, an oxygen plasma (See, S. Farrens, "Chemical free room temperature wafer to wafer bonding", J. Electrochem. Soc. Vol 142, p 3949, (1995)); an argon high-energy beam surface etching, and/or a wet chemical oxidizing acid such as $H_2SO_4$ or $HNO_3$ solution. The wet etching process is disclosed, for example, in M. Shimbo, etc. "Silicon-to-silicon direct bonding method", J. Appl. Phys. V60, p 2987 (1986).

Although hydrophobic surfaces may provide better electronic properties, hydrophilic surfaces may provide sufficient conductivity because the native oxide present at the bonding interface 14 is usually only 2-5 nm. Moreover, substrates formed by the direct bonding of two hydrophilic surfaces tend to have a large leakage current. Furthermore, crystalline junctions can be formed after a high-temperature anneal step is performed to further enhance the current flow across the bonding interface 14.

Direct semiconductor-to-semiconductor wafer bonding (with or without the surface treatments mentioned above) is achieved in the present invention by first bringing the two wafers having different crystal orientations into intimate contact with other, optionally applying an external force to the contacted wafers, and then optionally annealing the two contacted wafers under conditions that are capable of increasing the bonding energy between the two wafers. The annealing step may be performed in the presence, or absence, of an external force. Bonding is achieved typically during the initial contact step at nominal room temperature. By nominal room temperature, it is meant a temperature from about 15° C. to about 40° C., with a temperature of about 25° C. being more preferred.

After bonding, the wafers are typically annealed to enhance the bonding strength and improve the interface property. The annealing temperature is typically carried out at a temperature from about 900° to about 1300° C., with an annealing temperature from about 1000° to about 1100° C. being more typical. Annealing is performed within the aforementioned temperature ranges for various time periods that may range from about 1 hour to about 24 hours. The annealing ambient can be $O_2$, $N_2$, Ar, or a low vacuum, with or without external adhesive forces. Mixtures of the aforementioned annealing ambients, with or without an inert gas, are also contemplated herein.

Although high-temperature annealing (as described above) is often used, it is also possible to use a low temperature anneal (less than 900° C.) which can also achieve good mechanical and electrical properties.

It should be noted that the annealing step that follows the direct semiconductor-to-semiconductor bonding step can be performed at a single temperature using a specific ramp-up rate, or it can be performed using various temperatures in which various ramp-up rates and soak cycles are employed.

To obtain a certain predetermined thickness of the second semiconductor layer 16, various layer transfer techniques can be used in the present invention. One direct and simple approach that can be used in the present invention is to use wafer grinding, polishing or an etch back process. To provide better control of the layer transfer process, an etch stop layer located between second semiconductor layer 16 and a handling wafer can be used; the etch stop layer and the handling wafer are both removed after wafer bonding. The etch stop layer can be an insulator, such as an oxide, nitride or oxynitride, which means the starting top wafer may be an SOI substrate. Alternatively, the etch stop layer can be another semiconductor material which can be removed selectively from the second semiconductor layer 16 after bonding and also serves as an etch stop to remove the handling wafer.

Another layer transfer technique, applicable to embodiments where one of the wafers includes an ion implant region. In this case, the ion implant region forms a porous region which causes a portion of the wafer above the ion implant region to break off leaving a bonded wafer. The implant region is typically comprised of hydrogen ions that are implanted into the surface of one of the wafers utilizing ion implantation conditions that are well known to those skilled in the art. After bonding, a heating step is typically performed in an inert ambient at a temperature from about 100° to about 400° C. for a time period from about 2 to about 30 hours to increase the bonding energy. More preferably, the heating is performed at a temperature from about 200° to about 300° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. The layer splitting at the implant region will take place during a 350°-500° C. annealing afterwards.

The hybrid substrate 10 shown in FIG. 2 is used as the starting substrate for the method of the present invention that is depicted in FIGS. 3-7. The process flow depicted in these drawings will now be described in greater detail.

After providing the hybrid substrate 10 shown in FIG. 2, a hard mask, i.e., pad stack, 18 is formed on an exposed upper surface of the second semiconductor layer 16 utilizing a deposition process such as, for example, chemical vapor deposition (CVD), plasma-enhanced chemical vapor deposition (PECVD), chemical solution deposition, atomic layer deposition, or physical vapor deposition. Alternatively, the hard mask 18 can be formed utilizing a thermal oxidation, nitridation or oxynitridation process.

The hard mask 18 is composed of a dielectric material such as, for example, an oxide, nitride, oxynitride or a multilayered stack thereof. The thickness of the hard mask 18 may vary depending on the composition of the mask material as well as the technique that was used in forming the same. Typically, the hard mask 18 has, an as deposited thickness, from about 5 to about 500 nm.

Figure 3:
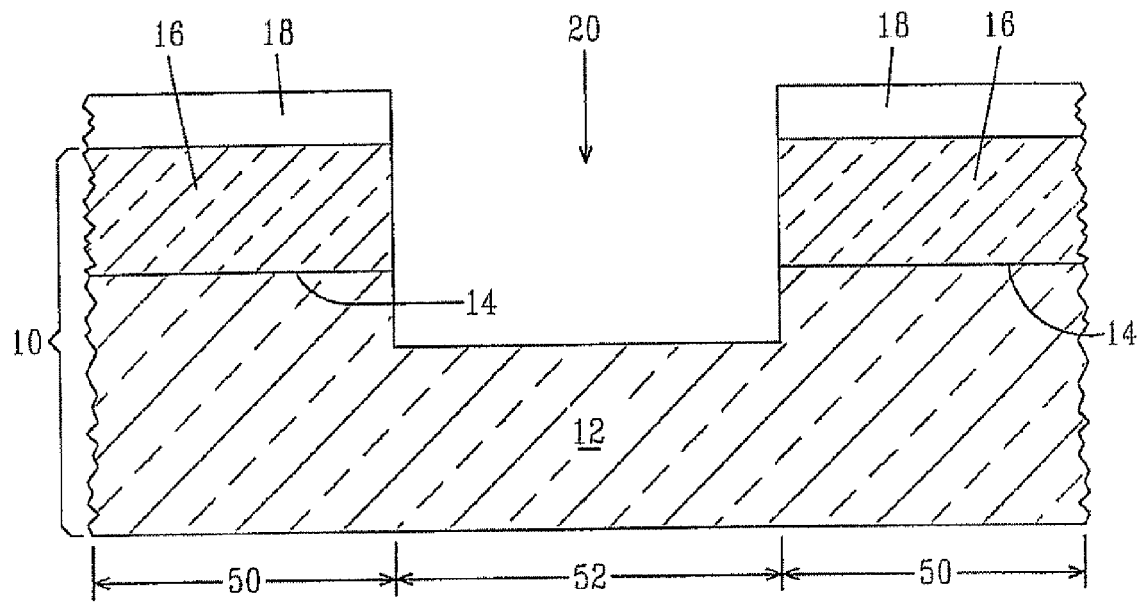
FIGS. 3-6 are pictorial representations (through cross sectional views) showing the basic processing steps that are employed in the present invention using the hybrid substrate shown in FIG. 2 as the starting substrate. Note that in the inventive process deeper trench isolation has been formed between nFETs and pFETs.

The hybrid substrate 10 including the hard mask 18 is then patterned by lithography and etching to provide a patterned structure such as shown, for example, in FIG. 3. As shown, at least one opening 20 is provided in the hybrid substrate 10 including the hard mask 18 that exposes a portion of the first semiconductor layer 12. The lithographic step includes applying a photoresist to the hard mask 18, exposing the photoresist to a desired pattern of radiation and developing the pattern into the exposed photoresist utilizing a conventional resist developer. The etching step used in forming the structure shown in FIG. 3 may be performed utilizing a single etching process or multiple etching steps may be employed. The etching may include a dry etching process such as reactive-ion etching, ion beam etching, plasma etching or laser etching, a wet etching process wherein a chemical etchant is employed or any combination thereof.

In accordance with the present invention, the etching depth of the opening 20 can be designed to match the requirement of isolation between opposite polarity devices, i.e., between nFETs and pFETs. The block level lithography used in providing the structure shown in FIG. 3, which defines the area of the nFETs and pFETs, has large features, usually several times larger than the critical dimension, and thus the at least one opening 20 does not have as high an aspect ratio as a normal litho level which defines the active area.

In the structure shown in FIG. 3, the area of the hybrid substrate 10 that is protected by the patterned hard mask 18 is referred to herein as a first device region 50, while the area that is etched and was thus not protected by the patterned hard mask 18 is referred to as a second device region 52. In accordance with the present invention, the first device region 50 is the area in which a first device having a first polarity is built, while the second device region 52 is the area in which a second device having a second polarity that is opposite to the first polarity is built.

Figure 4:
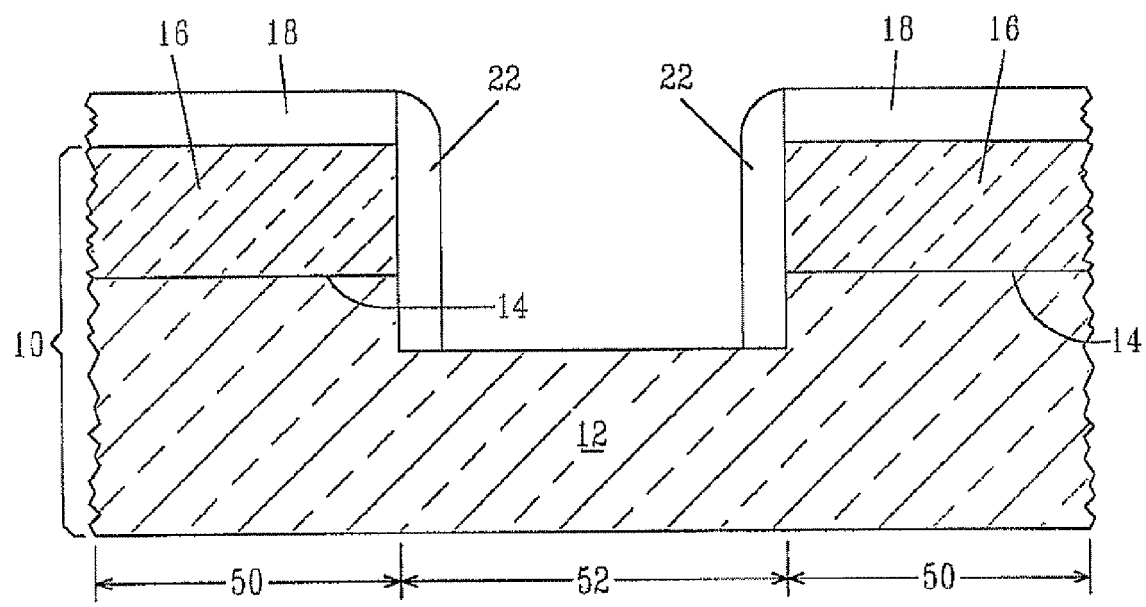

Next, a spacer 22 is formed in the opening 20 on the exposed sidewalls provided by the above processing steps. The spacer 22 is formed by deposition and etching. The spacer 22 can be comprised of an insulating material such as, for example, an oxide, nitride, oxynitride or any combination thereof. The spacer 22 may be a single spacer, as shown, or it may comprise multiple spacers. The spacer 22 employed in the present invention should cover the sidewall of the second semiconductor layer 16. The resultant structure including the spacer 22 formed into the opening 20 is shown in FIG. 4.

The thickness of the spacer 22 should meet the requirement of isolation spacing for an inter-well between nFETs and pFETs, which is mainly determined by lateral straggle of the high energy well implantation and dopant redistribution and interdiffusion at the well borders. Typically, the spacer 22 has a width as measured along the bottom surface from about 10 to about 1000 nm, with a width from about 50 to about 200 nm being even more typical. The insulating material of the spacer 22 should be different from that of the hard mask 18 so that the hard mask 18 can be removed selectively to the spacer 22 in a subsequent processing step of the present invention. In accordance with the present invention, the spacer 22 is a first trench isolation region having a first depth that is used in separating devices of different polarity from each other.

In some embodiments of the present invention (not shown), a deep well implant may be performed at this point of the inventive process into the opening 20, after spacer 22 formation. In such embodiments, the implantation energy can be reduced because the ions have a shorter distance to travel. Lower implantation energy corresponds to less lateral straggle, which allows for less inter-well isolation spacing.

Figure 5:
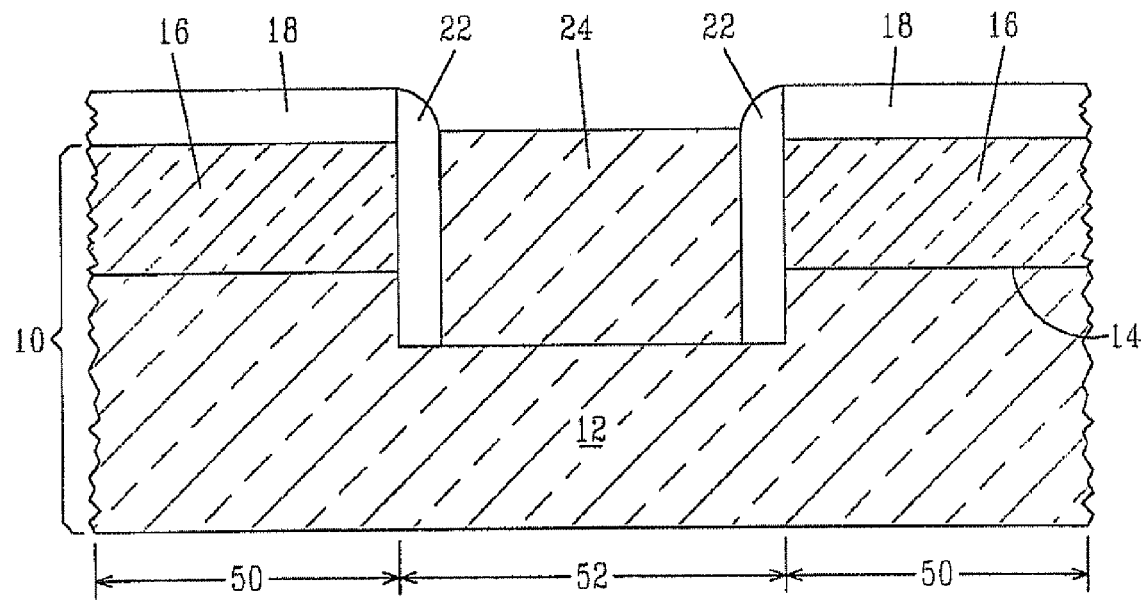

A semiconductor material 24 is then formed on the exposed surface of the first semiconductor layer 12 to provide the structure shown, for example, in FIG. 5. In accordance with the present invention, semiconductor material 24 has a crystallographic orientation that is the same as the crystallographic orientation of the first semiconductor layer 12. Although the regrown semiconductor layer 24 will have the same surface orientation as the first semiconductor layer 12, it can be of a different semiconductor material than the first semiconductor layer 12.

The semiconductor material 24 may comprise any semiconductor material, such as, for example, Si, strained Si, SiGe, SiC, SiGeC or combinations thereof, which is capable of being formed utilizing a selective epitaxial growth method. Semiconductor material 24 can be strained, unstrained, or it can be comprised of stained and unstrained layers, e.g., strained Si on a relaxed SiGe layer.

In some preferred embodiments, semiconductor material 24 is comprised of Si. In other preferred embodiments, the semiconductor material 24 is a strained Si layer that may or may not be located atop a relaxed SiGe alloy layer.

To achieve a high quality regrown semiconductor layer 24, selective epitaxy is recommended where there is no polysilicon or amorphous silicon formed on top of the patterned hard mask 18 outside the opening 20. To eliminate a facet formation during the epitaxy, the semiconductor material 24 can be grown, in some embodiments, higher than the patterned hard mask 18 and then it is polished down to the patterned hard mask 18.

In other embodiments, the regrown semiconductor material 24 may be recessed at this point of the present invention utilizing a timed etching process such as a timed RIE. One or more additional semiconductor layers can be formed directly on top of the recessed surface. The semiconductor materials formed would each have the same crystallographic orientation as that of the first semiconductor layer 12.

To achieve a coplanar surface, the semiconductor material 24 may need to be etched back to the same level as the second semiconductor layer 16. This etching can be performed by dry etching, wet etching or oxidation of silicon and then stripping away the oxide. If there is little or no facet growth, the thickness of the epitaxy material, i.e., semiconductor material 24, can be controlled by growth time so that the upper surface of the epitaxial material is substantially coplanar with the upper surface of the second semiconductor layer 16.

In some embodiments of the present invention, the semiconductor layer 24 can be formed by an in-situ doped epitaxial growth process. In-situ doping can achieve better control of the location of the dopant well, for example, the vertical dopant profile can be much sharper than the one obtained through implantation. Also, in-situ doping can reduce the traditional problem of dopant redistribution and interdiffusion at the well borders when both the n-well and the p-well are formed by ion implantation.

The patterned hard mask 18 is now removed from the structure utilizing a conventional stripping process that is capable of selectively removing the patterned hard mask 18 from the structure, especially to the spacer 22. The structure that is formed after the patterned hard mask 18 has been removed is shown, for example, in FIG. 6. In this structure, the first semiconductor device surface, i.e., second semiconductor layer 16, is substantially coplanar to the regrown semiconductor material 24.

Figure 6:
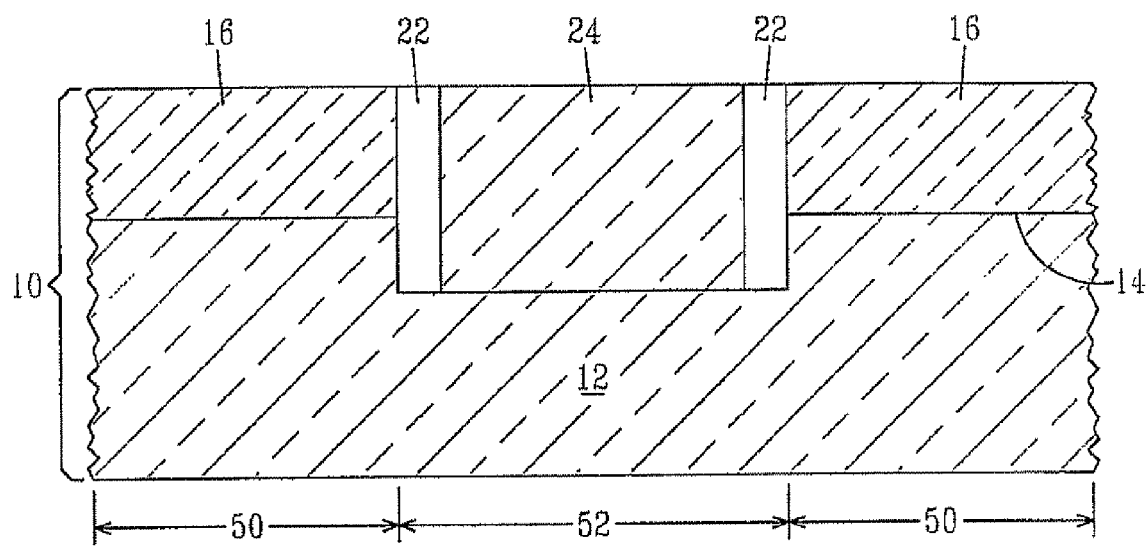

After providing the structure shown in FIG. 6, standard CMOS processing can be performed. First, a shallow trench isolation regions 26 are formed, where the trench depth is determined by the isolation of like-type devices (see, FIG. 7) between nFET and nFET, and pFET and pFET. Note that the depth of the trenches of the shallow trench isolation regions 26 is shallower than the depth of opening 20 and thus the spacer 22. In accordance with the present invention, the shallow trench isolation regions 26 form the second trench isolation regions having a second depth that is shallower than that of the first trench isolation region, i.e., spacer 22. In case the spacer 22 has been attacked during the hard mask 18 removal process, this shallow trench isolation can also be formed between nFET and pFET, simultaneously. Shallow trench isolation used at this point of the present invention in the dense area within like-kind devices, greatly simplify the isolation process.

The shallow trench isolation regions 26 are formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric.

Next, well regions (not specifically labeled) are formed into the exposed semiconductor device layers, i.e., layer 16 or the regrown semiconductor material 24, by utilizing ion implantation and annealing, both of which are well known to those skilled in the art. The well regions may be n-type well regions or p-type well regions depending on the type of semiconductor device to be formed on each semiconductor layer, i.e., second semiconductor layer 16 and regrown semiconductor material 24. For example, if the semiconductor device is a pFET, the well region will be an n-type well, while if the semiconductor device is an nFET, the well region is a p-type well. Doping of each well is performed in different implant steps in which an implant mask is formed atop locations in which the specific dopant is not intended to be implanted into. The depth of the well regions can vary depending on the implant and annealing conditions as well as the type of dopant used.

After well formation, semiconductor devices, i.e., pFETs and nFETs, are formed on the exposed semiconductor layers, i.e., second semiconductor layer 16 and regrown semiconductor material 24. Specifically, a first semiconductor device 32 is formed on a portion of the second semiconductor layer 16 (in the first device region 50) and a second semiconductor device 30 is formed on the regrown semiconductor material 24 (in the second device region 52). In accordance with the present invention, the first semiconductor device 32 may be a pFET or an nFET, whereas the second semiconductor device 30 may be an nFET or pFET, with the proviso that the first semiconductor device is different from the second semiconductor device and that the specific device is fabricated on a crystal orientation that provides a high performance device.

Figure 7:
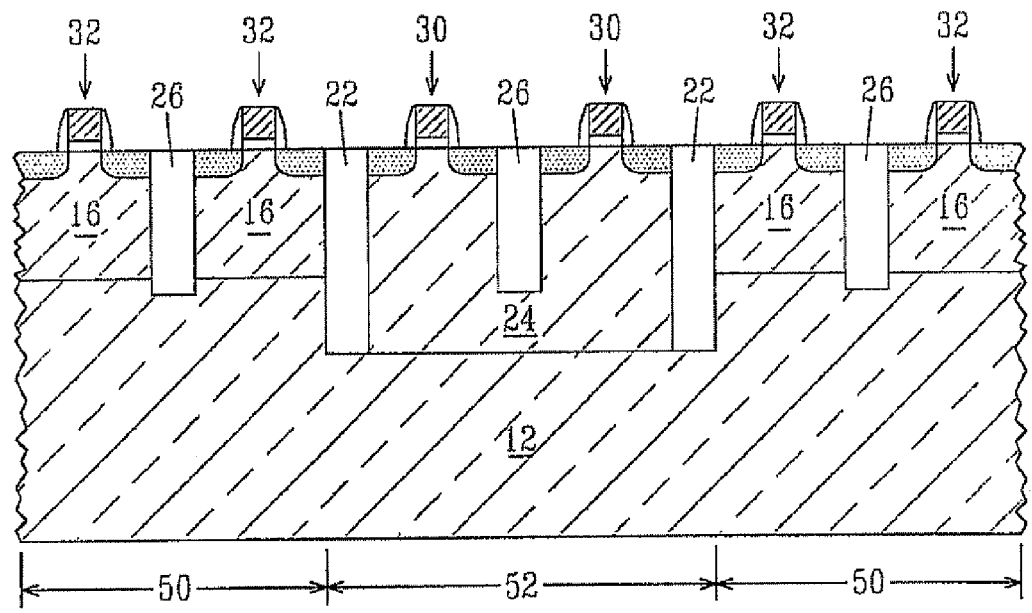
FIG. 7 is a pictorial representation (through a cross sectional view) showing shallower trench isolation located between like-kind FETs.

The pFETs and nFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, and source/drain diffusion regions. Note that the pFET is formed over the semiconductor material that has a (110) or (111) orientation, whereas the nFET is formed over a semiconductor surface having a (100) or (111) orientation. The resultant structure including bulk-like FETs is shown in FIG. 7.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a hybrid oriented substrate comprising a first device region having a first crystallographic orientation and a second device region having a second crystallographic orientation which differs from the first crystallographic orientation;
   a first trench isolation region of a first depth separating said first device region from said second device region;
   a plurality of second trench isolation regions of a second depth which is shallower than the first depth located in each of said first and second device regions; and
   first semiconductor devices of a first polarity located in said first semiconductor device region and second semiconductor devices of a second polarity that differs from the first polarity located in said second semiconductor device region, wherein said first semiconductor devices are separated by said first trench isolation region and said plurality of second trench isolation structures separate said first semiconductor devices or said second semiconductor devices from each other, and wherein said first trench isolation region has a first sidewall comprising an upper portion extending to a topmost surface of said first trench isolation region and directly contacting a second semiconductor layer of said second crystallographic orientation and a lower portion directly contacting a first semiconductor layer of said first crystallographic orientation, and a second sidewall that directly contacts a regrown semiconductor material of said first crystallographic orientation.

2. The semiconductor structure of claim 1 wherein the first crystallographic orientation is (110) and the second crystallographic orientation is (100).

3. The semiconductor structure of claim 2 wherein said first semiconductor devices are pFETs and second semiconductor devices nFETs.

4. The semiconductor structure of claim 1 wherein the first crystallographic orientation is (100) and the second crystallographic orientation is (110).

5. The semiconductor structure of claim 4 wherein said first semiconductor devices are nFETs and the second semiconductor devices are pFETs.

6. The semiconductor structure of claim 1 wherein said regrown semiconductor material is a Si-containing semiconductor.

7. The semiconductor structure of claim 1 wherein said first and second semiconductor layers are separated from each other by a conductive bonding interface.

8. The semiconductor structure of claim 1 wherein said first trench isolation region is a spacer.

9. The semiconductor structure of claim 8 wherein said spacer is a single spacer.

10. The semiconductor structure of claim 8 wherein said spacer comprises multiple spacers.

11. The semiconductor structure of claim 1 wherein said second semiconductor layer and said regrown semiconductor material have topmost surfaces that are coplanar with each other.

\* \* \* \* \*